(12) United States Patent
Lin et al.

(10) Patent No.: US 11,689,209 B2
(45) Date of Patent: Jun. 27, 2023

(54) ANALOG-TO-DIGITAL CONVERTER CIRCUITRY, AN INTEGRATED CIRCUIT DEVICE, A PHOTOPLETHYSMOGRAM DETECTOR, A WEARABLE DEVICE AND A METHOD FOR ANALOG-TO-DIGITAL CONVERSION

(71) Applicants: IMEC VZW, Leuven (BE); KATHOLIEKE UNIVERSITEIT LEUVEN, Leuven (BE); Stichting IMEC Nederland, Eindhoven (NL)

(72) Inventors: Qiuyang Lin, Leuven (BE); Nick Van Helleputte, Korbeek-Dijle (BE); Roland Van Wegberg, Oss (NL); Shuang Song, Eindhoven (NL)

(73) Assignees: KATHOLIEKE UNIVERSITEIT LEUVEN, Leuven (BE); IMEC VZW, Leuven (BE); STICHTING IMEC NEDERLAND, Eindhoven (NL)

( * ) Notice: Subject to any disclaimer, the term of this patent is extended or adjusted under 35 U.S.C. 154(b) by 0 days.

(21) Appl. No.: 17/590,211

(22) Filed: Feb. 1, 2022

(65) Prior Publication Data
US 2022/0255554 A1    Aug. 11, 2022

(30) Foreign Application Priority Data
Feb. 5, 2021 (EP) .................................. 21155525

(51) Int. Cl.
H03M 1/06 (2006.01)
(52) U.S. Cl.
CPC .................. H03M 1/0604 (2013.01)
(58) Field of Classification Search
CPC .... H03M 1/6004; H03M 1/54; H03M 1/0607; H03M 1/1225; H03M 1/52; H03M 1/0854
See application file for complete search history.

(56) References Cited

U.S. PATENT DOCUMENTS

| | | | |
|---|---|---|---|
| 6,504,498 B1 * | 1/2003 | O'Brien | H04B 17/20 341/118 |
| 7,429,941 B1 * | 9/2008 | Draxelmayr | H03M 3/362 341/143 |

(Continued)

OTHER PUBLICATIONS

Shu et al., "A 4.5mm² Multimodal Biosensing SoC for PPG, ECG, BIOZ and GSR Acquisition in Consumer Wearable Devices", 2020 IEEE International Solid-State Circuits Conference, Session 26, Biomedical Innovations, 26.1, pp. 400-402, 2020.

(Continued)

*Primary Examiner* — Lam T Mai
(74) *Attorney, Agent, or Firm* — Moser Taboada

(57) ABSTRACT

An analog-to-digital converter, ADC, circuitry, comprises: an integrator connected to a capacitor, the integrator being configured to switch between integrating an analog input signal for ramping an integrator output and integrating a reference input signal for returning integrator output towards a threshold; a comparator for comparing integrator output to the threshold; and a timer for determining a time duration during which the reference input signal is integrated, the time duration providing a digital representation of an analog input signal value; the ADC circuitry further comprising a feedforward noise shaping loop configured to store a quantization error signal based on digitizing a first sample, the comparator being configured to receive a feedforward noise shaping signal for changing the threshold for digitizing a later sample of the analog input signal following the first sample.

15 Claims, 10 Drawing Sheets

(56) References Cited

U.S. PATENT DOCUMENTS

| | | | | |
|---|---|---|---|---|
| 8,890,735 | B2* | 11/2014 | Pinna | H03M 3/39 |
| | | | | 375/252 |
| 10,177,776 | B1* | 1/2019 | Ma | H03F 3/19 |
| 10,348,282 | B1* | 7/2019 | Lesso | H03K 5/135 |
| 10,763,888 | B1* | 9/2020 | Zhang | H03M 3/352 |
| 10,784,890 | B1* | 9/2020 | Hughes | H03M 3/48 |
| 2005/0184895 | A1* | 8/2005 | Petersen | A61B 5/14551 |
| | | | | 341/143 |
| 2007/0132618 | A1* | 6/2007 | Petersen | A61B 5/7228 |
| | | | | 341/143 |
| 2007/0268161 | A1* | 11/2007 | Hernandez | H03M 1/504 |
| | | | | 341/50 |
| 2008/0315928 | A1* | 12/2008 | Waheed | H04L 27/0014 |
| | | | | 341/131 |
| 2018/0309458 | A1* | 10/2018 | Bandyopadhyay | H03M 1/804 |
| 2020/0372895 | A1* | 11/2020 | Ninagawa | H03K 5/1536 |
| 2021/0126648 | A1* | 4/2021 | Zhang | H03M 1/1061 |
| 2021/0376839 | A1* | 12/2021 | Vergauwen | H03M 1/10 |

OTHER PUBLICATIONS

Marefat et al; "A 280μW 108dB DR Readout IC with Wireless Capacitive Powering Using a Dual-Output Regulating Rectifier for Implantable PPG Recording", 2020 IEEE International Solid-State Circuits Conference, Session 26, Biomedical Innovations, 26.7, pp. 412-414, 2020.

Kim et al., "A <25 μW CMOS Monolithic Photoplethysmographic Sensor with Distributed 1b Delta-Sigma Light-to-Digital Converter", $43^{rd}$ IEEE European Solid State Circuits Conference, pp. 55-58, 2017.

Rogi et al., "A Low-Power Auto-Zero Switched-Capacitor Dual-Slope Noise-Shaping Direct CDC", $44^{th}$ IEEE European Solid State Circuits Conference, pp. 198-201, 2018.

Maghari et al., "A Third-Order DT ΔΣ Modulator Using Noise-Shaped Bi-Directional Single-Slope Quantizer", IEEE Journal of Solid-State Circuits, vol. 46, No. 12, pp. 2882-2891, 2011.

Sanjurjo et al., "An Energy-Efficient 17-bit Noise-Shaping Dual-Slope Capacitance-to-Digital Converter for MEMS Sensors", $42^{nd}$ European Solid State Circuits Conference, pp. 389-392, 2016.

Sriatala et al., "Improving Dual-Slope A/D Converter with Noise-Shaping and Digital Filtering Techniques", Proceedings of the $26^{th}$ International Conference 'Mixed Design of Integrated Circuits and Systems', pp. 236-240, 2019.

Maghari et al., "A Double-Sampled Path-Coupled Single-Loop ΣΔ Modulator Using Noise-Shaped Integrating Quantizer", 2010 IFFF International Symposium on Circuits and Systems, pp. 4005-4008, 2010.

Leuenberger et al., "A Single OpAmp $2^{nd}$-Order ΔΣ ADC with a Double Integrating Quantizer", 2015 IEEE International Symposium on Circuits and Systems, pp. 309-312, 2015.

Extended European Search Report for European Patent Application No. 21155525.5 dated Jul. 2, 2021.

* cited by examiner

ANALOG-TO-DIGITAL CONVERTER CIRCUITRY, AN INTEGRATED CIRCUIT DEVICE, A PHOTOPLETHYSMOGRAM DETECTOR, A WEARABLE DEVICE AND A METHOD FOR ANALOG-TO-DIGITAL CONVERSION

CROSS-REFERENCE TO RELATED APPLICATIONS

This application claims benefit of EPC Application No. 21155525.5 filed on Feb. 5, 2021, which is herein incorporated by reference in its entirety.

TECHNICAL FIELD

The present inventive concept relates to an analog-to-digital converter (ADC) circuitry and a method for analog-to-digital conversion. The present inventive concept also relates to the ADC circuitry being implemented in an integrated circuit device, in a photoplethysmogram detector and/or in a wearable device.

BACKGROUND

An integrating ADC is a type of ADC that is configured to convert an unknown analog input signal into a digital representation through using an integrator. The integrating ADC may be implemented as a dual-slope ADC, wherein the integrator integrates the analog input signal for ramping an integrator output for a fixed time period (run-up time period). Then, the integrator integrates a reference input signal for returning the integrator output to a threshold (run-down time period). The analog input signal may be determined as a function of the reference input signal, the run-up time period and the run-down time period. The run-down time period may be measured based on a clock of the ADC, such that use of longer integration times allow for higher resolution of the determination of the analog input signal.

Thus, the integrating ADC may provide a high resolution conversion of the analog input signal, but at a sacrifice of conversion speed. A slow conversion speed is also associated with a large power consumption.

In J. P. Sanjurjo et al, "An Energy-Efficient 17-bit Noise-Shaping Dual-Slope Capacitance-to-Digital Converter for MEMS Sensors", ESSCIRC Conference 2016: $42^{nd}$ European Solid-State Circuits Conference, Lausanne, 2016, pp. 389-392, a noise-shaping dual-slope capacitance-to-digital converter is presented. An error feedback architecture is used, wherein quantization error noise-shaping is used to reduce measurement time. However, there may still be room for improvement in resolution, conversion speed and/or power consumption of an ADC circuitry.

SUMMARY

An objective of the present inventive concept is to provide analog-to-digital conversion of an analog input signal, wherein a high resolution may be obtained within a short conversion time. Another objective of the present inventive concept is to provide analog-to-digital conversion using a low power consumption.

These and other objectives of the present inventive concept are at least partly met by the invention as defined in the independent claims. Preferred embodiments are set out in the dependent claims.

According to a first aspect, there is provided an analog-to-digital converter (ADC) circuitry, comprising: an input for receiving an analog input signal to be converted to a digital representation, and a reference input signal; an integrator connected to a capacitor, wherein the integrator is configured to switch between integrating the analog input signal for ramping an integrator output and allow a charge to build up on the capacitor and integrating the reference input signal for returning integrator output towards a threshold; a comparator for comparing integrator output to the threshold; and a timer for determining a time duration during which the reference input signal is integrated for changing the integrator output to reach the threshold, wherein the time duration provides a digital representation of an analog input signal value; wherein the ADC circuitry further comprises a feedforward noise shaping loop comprising at least one noise shaping capacitor configured to store a quantization error signal remaining on the integrator output based on digitizing a first sample of the analog input signal, wherein the comparator is configured to receive a feedforward noise shaping signal from the feedforward noise shaping loop based on the quantization error signal stored by the at least one noise shaping capacitor for changing the threshold of the comparator for digitizing a later sample of the analog input signal following the first sample.

The ADC circuitry according to the first aspect comprises a feedforward noise shaping loop comprising at least one noise shaping capacitor. This implies that, in addition to the capacitor associated with the integrator for holding an integrator output signal, a noise shaping capacitor is provided for enabling noise shaping. The use of the feedforward noise shaping loop allows a high resolution of the analog-to-digital conversion to be obtained in a relatively short time duration.

The timer may be based on a clock of the ADC circuitry. Thanks to the use of the feedforward noise shaping loop, the analog-to-digital conversion can be obtained in few clock periods for utilizing a short time duration. Hence, the ADC circuitry allows relaxation of requirement of clock rate, while enabling the analog-to-digital conversion to be obtained quickly. Thus, the ADC circuitry may perform analog-to-digital conversion with high resolution and low power consumption.

Compared to an ADC circuitry without noise shaping, reduction of quantization error provided by the feedforward noise shaping loop of the ADC circuitry according to the first aspect may be utilized for providing a higher resolution analog-to-digital conversion (with a corresponding conversion time) or a shorter conversion time (with a corresponding resolution).

In relation to the error feedback architecture disclosed in J. P. Sanjurjo et al, "An Energy-Efficient 17-bit Noise-Shaping Dual-Slope Capacitance-to-Digital Converter for MEMS Sensors", ESSCIRC Conference 2016: $42^{nd}$ European Solid-State Circuits Conference, Lausanne, 2016, pp. 389-392, the noise shaping capacitor can be reset between samples of the analog input signal. This implies that the ADC circuitry according to the first aspect is not prone to drift of the analog input signal from the threshold.

Further, the ADC circuitry according to the first aspect enables storing of the quantization error on the noise shaping capacitor, such that the integrator may be shut down while the quantization error is stored. This implies that the integrator may be shut down or duty-cycled between processing of samples to save power of the ADC circuitry, while enabling noise shaping to be provided.

The ADC circuitry may be used for first order noise shaping. In such case, a single noise shaping capacitor may be used. However, it should be realized that the ADC circuitry may alternatively be used for higher order noise shaping, which may be used for providing an improved resolution or reduced conversion time.

Further, the ADC circuitry also enables using multiple channel inputs to the same ADC circuitry. Quantization errors for different channels may be stored in different noise shaping capacitors. This implies that the ADC circuitry is suited for use with multiplexed input of analog input signals such that the ADC circuitry may e.g. support a plurality of sensors providing a plurality of analog input signals.

As used herein, the term "noise shaping capacitor" should not be understood as the capacitor itself providing a noise shaping function of the ADC circuitry. Rather, the capacitor is part of a noise shaping loop for providing the noise shaping function and the term "noise shaping capacitor" is used in order to differentiate the "noise shaping capacitor" from other capacitors in the circuitry.

The reference input signal and the threshold may be selected such that a value of the threshold is between values of the analog input signal and the reference input signal. This may be utilized such that the integrator integrating the analog input signal followed by integrating the reference input signal will result in the integrator output being returned towards the threshold by the integrating of the reference input signal. When the threshold is changed based on the feedforward noise shaping signal, a value of the threshold may still be maintained between values of the analog input signal and the reference input signal.

The feedforward noise shaping loop may form a filter for providing the feedforward noise shaping signal based on the quantization error signal. For instance, in first order noise shaping, a finite impulse response (FIR) filter may be provided, whereas in higher order noise shaping an infinite impulse response (IIR) filter may be provided.

According to an embodiment, the feedforward noise shaping loop comprises two sets of noise shaping capacitors for storing quantization error signals from digitizing a first and a second sample of the analog input signal, respectively, wherein the feedforward noise shaping loop forms a second order noise shaping loop using quantization error signals from the first sample and the second sample for changing the threshold of the comparator for digitizing a third sample of the analog input signal following the first and the second samples.

When the ADC circuitry uses a second or higher order noise shaping, the quantization error from a particular sample is utilized for providing the feedforward noise shaping signal for two or more following samples. Thus, in order to maintain quantization error information over plural samples for second or higher order noise shaping, plural noise shaping capacitors are needed.

When the ADC circuitry uses second order noise shaping, the quantization error signal for a sample may be stored in each of two noise shaping capacitors of a set. This implies that the set may comprise two noise shaping capacitors having different capacitances. Each of the two noise shaping capacitors of the set may be adapted for providing a weight of the quantization error in dependence of whether the quantization error represents the first sample or the second sample, when digitizing a third sample. Thus, the quantization error being stored in the set may be utilized for determining the feedforward noise shaping signal for two following samples, without a need to move quantization error information between different capacitors for re-using the quantization error information for the two following samples. It should be further realized that for higher order noise shaping, each set may comprise further noise shaping capacitors such that the quantization error being stored in the set may be utilized for determining the feedforward noise shaping signal for plural following samples.

According to an embodiment, the feedforward noise shaping loop further comprises a noise shaping integrator for summing quantization error signals from each of the two sets of noise shaping capacitors to form the feedforward noise shaping signal.

This implies that the feedforward noise shaping loop may form a filter based on the noise shaping integrator. Thanks to summing of quantization error signals from each set of noise shaping capacitors, influence of quantization errors from two previous samples may be used for forming the feedforward noise shaping signal.

According to an embodiment, each set of noise shaping capacitors comprises a first noise shaping capacitor having a first capacitance and a second noise shaping capacitor having a second capacitance, and wherein the noise shaping integrator is configured to receive a quantization error signal from the first noise shaping capacitor of the set of noise shaping capacitors representing the second sample and a quantization error signal from the second noise shaping capacitor of the set of noise shaping capacitors representing the first sample.

Thus, each set of noise shaping capacitors comprises a first noise shaping capacitor and a second noise shaping capacitor, which are dedicated for representing the quantization error of the first sample and the second sample, respectively. Hence, the noise shaping integrator may, for each noise feedforward noise shaping signal to be determined, receive the quantization error from either the first noise shaping capacitor or the second noise shaping capacitor of the set.

When a quantization error of a sample is stored to the set, the quantization error may be stored to each of the first noise shaping capacitor and the second noise shaping capacitor. The set may thus be used for determining the feedforward noise shaping signal for plural following samples, by the noise shaping integrator using the quantization error signal from the appropriate noise shaping capacitor of the set.

The second capacitance may be different from the first capacitance such that different weights may be given to the quantization error signal in dependence of whether the quantization error stored in the set represents the first sample or the second sample, when digitizing a third sample.

The noise shaping capacitors of the sets have a relationship with a feedback capacitor of the noise shaping integrator. Together, the capacitors and the noise shaping integrator form a filter. As long as the filter is stable, the capacitances of the capacitors can have different values.

According to an embodiment, the feedforward noise shaping loop is configured to alternatingly store quantization error signals of a sequence of samples in a first set of noise shaping capacitors and in a second set of noise shaping capacitors.

This implies that the set storing quantization error signals relating to an oldest sample may be overwritten when a new quantization error signal is to be stored. Hence, quantization error signals may be easily stored in the sets without need to move quantization error information between different capacitors for re-using the quantization error information for the two following samples.

According to an embodiment, the ADC circuitry further comprises a gain element for amplifying the feedforward noise shaping signal.

The gain element may be used for further shaping the noise. The gain element may be arranged in the comparator but may alternatively be arranged in a separate amplifier of the feedforward noise shaping loop.

The filter provided by the feedforward noise shaping loop with the gain of the gain element should be designed such that a stable filter is provided. The gain of the gain element may be larger than 1 as long as a stable filter is provided, but in some instances the gain of the gain element may be less than 1 in order to obtain a stable filter.

According to an embodiment, the input is configured to receive analog input signals in multiple channels, wherein the ADC circuitry comprises multiple feedforward noise shaping loops for storing quantization error signals for the multiple channels.

This implies that multiplexing of the analog input signals in the multiple channels may be provided. The ADC circuitry may thus be used for plural analog input signals, such that the integrator and the comparator may be re-used for the multiple channels.

Each feedforward noise shaping loop may be dedicated to a specific channel. Hence, quantization error signals may be stored in the feedforward noise shaping loop between different time slots relating to the specific channel in a time-multiplexed input signal.

According to an embodiment, the timer comprises a counter configured to output a multi-bit digital representation of the analog input signal value.

This implies that the timer may represent the analog input signal with a high resolution digital representation. Thus, the quantization error signal will be relatively small compared to the analog input signal.

According to an embodiment, the ADC circuitry is configured to receive the analog input signal in current domain, voltage domain or charge domain.

This implies that the ADC circuitry may be adapted for handling analog input signals from various sources, wherein the input signal may be a current, voltage or a charge stored on a capacitor.

According to an embodiment, the input is configured to selectively receive one of a plurality of reference input signals for multi-slope analog-to-digital conversion.

The reference input signals may have different values, such that the integrator may be configured to integrate a first reference input signal having a large first value during a first time duration until the integrator output reaches a first threshold and the integrator may further be configured to integrate a second reference input signal having a small second value, smaller than the first value, during a second time duration until the integrator reaches a second threshold. This implies that the integration towards a final threshold may be divided into several periods (or slopes) during which different reference input signals are provided. Hence, the total time for reaching the final threshold may be reduced compared to the reference input signal having the smallest value being used for the entire time duration. Still, the same resolution of the determination of the analog input signal may be provided, since the reference input signal having the smallest value may be used during a final period of integrating reference input signals, such that the quantization error is defined based on the reference input signal having the smallest value.

Alternatively, the plurality of reference input signals may be adapted for determining digital representations of the analog input signal within different ranges. Thus, the ADC circuitry may use one reference input signal for determining the digital representation of an analog input signal, wherein the reference input signal is selected based on a range within which a value of the analog input signal falls.

According to an embodiment, the input is configured to receive a differential analog input signal and a differential reference input signal and wherein the integrator is configured to output a differential integrator output for fully differential analog-to-digital conversion of the analog input signal.

Thus, the ADC circuitry may be used for fully differential applications.

According to a second aspect, there is provided an integrated circuit device, comprising: an ADC circuitry according to the first aspect, wherein the ADC circuitry is configured to receive an analog input signal for converting the analog input signal to a digital representation; and digital processing circuitry for digital processing of the digital representation of the analog input signal.

Effects and features of this second aspect are largely analogous to those described above in connection with the first aspect. Embodiments mentioned in relation to the first aspect are largely compatible with the second aspect.

Thus, the ADC circuitry may be provided together with a digital processing circuitry on an integrated circuit device. This allows for a compact arrangement of the ADC circuitry with the digital processing circuitry. For instance, the digital processing circuitry may implement digital control blocks and/or filters for further processing the digital representation of the signal output by the ADC circuitry.

According to a third aspect, there is provided a photoplethysmogram (PPG) detector, comprising: at least one light source configured to generate pulsed light to illuminate skin of a subject for generating light modulated by blood flow of the subject; a light detector configured to receive the modulated light from the subject, said light detector configured to generate an analog input signal; and an ADC circuitry according to the first aspect, wherein the ADC circuitry is configured to receive the analog input signal from the light detector for converting the analog input signal to a digital representation.

Effects and features of this third aspect are largely analogous to those described above in connection with the first and second aspects. Embodiments mentioned in relation to the first and second aspects are largely compatible with the third aspect.

The PPG detector may need support for handling a high dynamic range of the analog input signal. For instance, large motion artifacts may cause need for handling a high dynamic range. The ADC circuitry according to the first aspect may be suited for handling a high dynamic range of the analog input signal, since the ADC provides a high resolution, while the use of the feedforward noise shaping loop allows the analog-to-digital conversion to be quickly performed.

The PPG detector may be configured to receive light being reflected by blood or to receive light being transmitted through blood. In a reflection-type measurement, the light source and the light detector may be arranged at a common side of the skin, whereas, in a transmission-type measurement, the PPG detector may be configured to be arranged around a body part such that the light source and the light detector are arranged on opposite sides of the body part, e.g. by the PPG detector being arranged around a finger or an earlobe of the subject.

According to an embodiment, the PPG detector is configured to detect a PPG at a chest of the subject. Due to movements of the subject at the chest, e.g. from breathing, the ADC circuitry may need to handle a very high dynamic range of the analog input signal, such as a dynamic range larger than 120 dB. Thanks to the ADC circuitry according to the first aspect, analog input signals for a chest PPG may be handled.

Thus, the PPG detector according to the third aspect is possible to use at a chest. This enables a PPG detector to be incorporated in a device which is to be arranged at the chest of a subject, e.g. for acquisition of an electrocardiogram (ECG). Hence, the PPG detector may be arranged in the same device such that a subject need not to wear two different devices at different parts of the body in order to obtain both an ECG and a PPG.

According to an embodiment, the PPG detector further comprises a DC compensation loop synchronized with the pulsed light, wherein the DC compensation loop comprises a current digital-to-analog converter connected at the input for subtracting DC components from the analog input signal, wherein the DC compensation loop further comprises a threshold filter for providing an output for controlling the current digital-to-analog converter based on the digital representation of the analog input signal.

The DC compensation loop allows large DC components to be removed from the analog input signal. For instance, if a chest PPG is acquired, the analog input signal will include a large DC component, on top of which influence of light being modulated by blood flow of the subject will be provided. Hence, thanks to the current digital-to-analog converter being synchronized with the pulsed light, a compensation for the large DC component is enabled. This implies that a higher input range is enabled, which further boosts the dynamic range handled by the ADC circuitry.

According to an embodiment, the at least one light source is configured to alternatingly generate pulsed light of two different wavelengths for enabling detection of blood oxygen saturation, wherein the analog input signal comprises two alternating signals related to the two different wavelengths, and wherein the ADC circuitry comprises two feedforward noise shaping loops for handling noise shaping of the two alternating signals.

In detection of blood oxygen saturation, measurements may be needed for two different wavelengths. Thanks to the ADC circuitry being provided with two feedforward noise shaping loops, each feedforward noise shaping loop may be dedicated to the analog input signal for one of the wavelengths. Thus, the ADC circuitry may be re-used for analog-to-digital conversion of both the analog input signals relating to the respective wavelengths.

The two different wavelengths may comprise an infrared wavelength, such as 940 nm, and a red wavelength, such as 655 nm.

According to a fourth aspect, there is provided a wearable device comprising: the PPG detector according to the third aspect, at least one carrier, which is configured to be worn on or around a body part of the subject, wherein the at least one carrier is configured to carry the PPG detector.

Effects and features of this fourth aspect are largely analogous to those described above in connection with the first, second, and third aspects. Embodiments mentioned in relation to the first, second, and third aspects are largely compatible with the fourth aspect.

The at least one carrier may be provided e.g. as a bracelet which may be worn around a wrist or an ankle of the subject, or as a strap, which may be arranged around a chest of the subject. The at least one carrier may alternatively be provided as a patch, which may be configured to be attached to a body part. As a further alternative, the carrier may have a form factor allowing the carrier to be worn partly around a body part, such as the carrier being provided as a clip, which may be clipped on opposite sides of a body part, such as on a finger or an earlobe.

Thanks to providing a wearable device, the PPG detector may be worn by the subject such that PPG measurements may be performed during daily life of the subject. Thus, the wearable device may be provided so as to minimally affect the user that wears the wearable device.

According to a fifth aspect, there is provided a method for analog-to-digital conversion of an analog input signal, comprising: select to receive, during a first time period, a first sample of an analog input signal to be converted to a digital representation at an input of an analog-to-digital converter, ADC, circuitry; integrate the analog input signal by an integrator connected to a capacitor during the first time period for ramping an integrator output; select to receive, during a second time period following the first time period, a reference input signal at the input; integrate the reference input signal for returning integrator output towards a threshold; compare the integrator output at a comparator to the threshold; determine a time duration of the second time period during which the reference input signal is integrated for changing the integrator output to reach the threshold, wherein the time duration provides a digital representation of an analog input signal value; store, in at least one noise shaping capacitor of a feedforward noise shaping loop, a quantization error signal remaining on the integrator output, after the second time period; and generate a feedforward noise shaping signal based on the stored quantization error signal and change the threshold of the comparator based on the feedforward noise shaping signal for a later sample of the analog input signal.

Effects and features of this fifth aspect are largely analogous to those described above in connection with the first, second, third, and fourth aspects. Embodiments mentioned in relation to the first, second, third, and fourth aspects are largely compatible with the fifth aspect.

The use of the feedforward noise shaping loop allows the method to provide a high resolution of the analog-to-digital conversion in a relatively short time duration.

BRIEF DESCRIPTION OF THE DRAWINGS

The above, as well as additional objects, features and advantages of the present inventive concept, will be better understood through the following illustrative and non-limiting detailed description, with reference to the appended drawings. In the drawings like reference numerals will be used for like elements unless stated otherwise.

DETAILED DESCRIPTION

Figure 1:
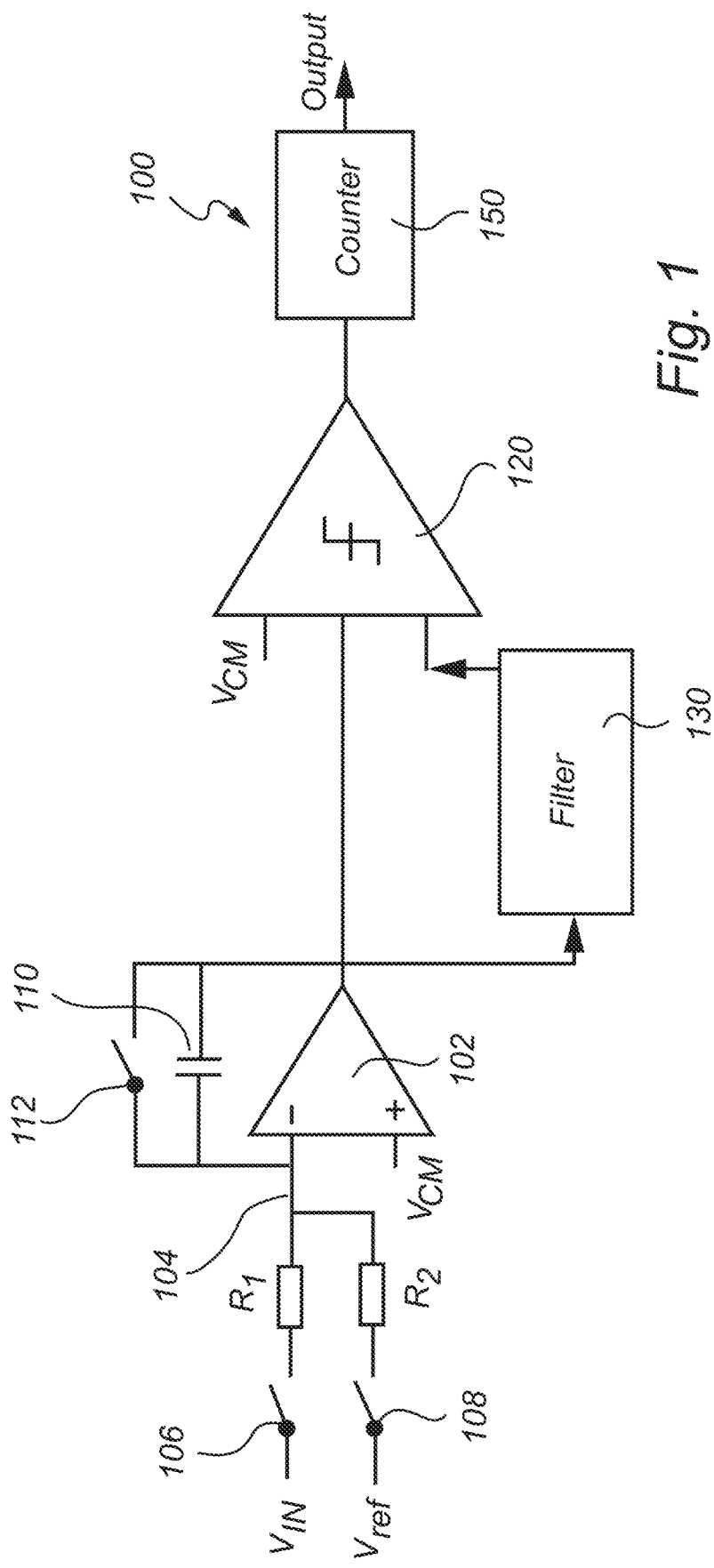
FIG. 1 is a schematic view of an analog-to-digital converter (ADC) circuitry according to an embodiment, wherein the ADC circuitry is configured to receive an analog input signal in voltage domain.

Referring now to FIG. 1, an analog-to-digital converter (ADC) circuitry 100 will be described. The ADC circuitry 100 is configured as an integrating ADC such that a digital representation of an analog input signal may be acquired based on the ADC circuitry 100 comprising an integrator 102 integrating the analog input signal in a run-up time period and integrating a reference input signal in a run-down time period. A relation between the run-up time period and the run-down time period could then be used for determining the digital representation of the analog input signal value.

The ADC circuitry 100 comprises an input 104 for receiving an analog input signal ($V_{IN}$), which is to be converted to a digital representation by the ADC circuitry 100. The input 104 is further configured to receive the reference input signal ($V_{ref}$). Switches 106, 108 may be used for controlling whether the analog input signal or the reference input signal are to be provided to the input 104 of the ADC circuitry 100.

The input 104 may be connected to the integrator 102 of the ADC circuitry 100. The integrator 102 may thus switchably receive the analog input signal and the reference input signal on the input 104 based on selection by the switches 106, 108.

The integrator 102 may be provided as an operational amplifier having an inverting input and a non-inverting input. The inverting input may receive the signal from the input 104 of the ADC circuitry, whereas the inverting input may receive an integrator reference signal ($V_{CM}$). The integrator reference signal may be a ground signal but may alternatively have another non-zero value.

Thus, the integrator 102 may be configured to integrate a difference between the analog input signal and the integrator reference signal during a first time period. During the first time period, a value at an integrator output may be ramped. The integrator output may be stored on a capacitor 110, which may be connected between the integrator output and the inverting input of the integrator 102.

Thus, after the first time period, which may be fixed at a constant duration, the capacitor 110 stores a charge corresponding to the analog input signal and the duration of the first time period.

The integrator 102 may further be configured to integrate a difference between the reference input signal and the integrator reference signal during a second time period. During the second time period, the value at the integrator output after the first time period, as stored by the capacitor 110, will be returned towards a threshold.

The ADC circuitry 100 further comprises a comparator 120. The comparator 120 is configured to compare the integrator output to the threshold, in the form of a threshold signal. As indicated in FIG. 1, the threshold signal may correspond to the integrator reference signal, such that the comparator 120 may receive as input the same signal as the integrator reference signal, $V_{CM}$, for defining the threshold of the comparator 120. The comparator 120 may further receive the integrator output as input to the comparator 120.

The comparator 120 may be provided as an operational amplifier. The comparator 120 may be configured to compare integrator output signal to the threshold in order to determine which signal is larger. The comparator 120 may provide a digital output signal, which may be set to "zero" if the integrator output signal is larger and "one" if the threshold is larger, or vice versa. Hence, the output from the comparator 120 switching from "zero" to "one" may be used as an indication of an end of the run-down time period.

The ADC circuitry 100 may further comprise a feedforward noise shaping loop 130. The feedforward noise shaping loop may be configured to store a quantization error signal remaining on the integrator output when the comparator 120 indicates an end of the run-down time period. Thus, when a first sample of the analog input signal is digitized, the quantization error in digitizing the first sample may be stored in the feedforward noise shaping loop 130. The stored quantization error may then be taken into account when a second sample of the analog input signal following the first sample is digitized. The quantization error may be taken into account by the feedforward noise shaping loop 130 providing a feedforward noise shaping signal to the comparator 120 for changing the threshold of the comparator 120.

Hence, the comparator 120 may compare the integrator output signal to the threshold signal as affected by the feedforward noise shaping signal. Thus, the feedforward noise shaping loop 130 may be configured to change the threshold of the comparator 120.

The feedforward noise shaping loop 130 may provide a filter of any order, such as a first or second order filter. Thus, the number of samples preceding a current sample that are taken into account for digitizing of the current sample may differ. In a first order feedforward noise shaping loop 130, the quantization error of one preceding sample to the current sample may be taken into account, whereas in a second order feedforward noise shaping loop 130, the quantization error of two preceding samples to the current sample may be taken into account, and so forth.

The use of the feedforward noise shaping loop 130 allows a high resolution of the analog-to-digital conversion to be obtained in a relatively short time duration.

The ADC circuitry 100 further comprises a timer 150. The timer 150 may be configured to determine a time duration of the run-down time period. The run-up time period may be fixed and, hence, may be controlled by a preset length of a control signal for selecting the switch 106 so as to provide the analog input signal to the input 104 of the ADC circuitry 100. However, the run-down time period is not known and may thus be determined by the timer 150. The timer 150 may thus be reset when the switch 106 is turned off and the switch 108 is turned on. Thereafter, the timer 150 may determine the time duration until the signal from the comparator 120 switches from "zero" to "one" or vice versa.

The timer 150 may be implemented as a counter 150 configured to output a multi-bit digital representation of the analog input signal value. The time duration of the run-down time period may be determined based on a clock of the ADC circuitry 100, such that the counter 150 may be incremented by one for each clock period until the end of the time duration is determined.

The counter 150 provides a multi-bit digital representation of the analog input signal value. Thus, the quantization error may be relatively small corresponding to a value represented by the least significant bit of the multi-bit representation.

The counter 150 may thus provide an output of a time duration as determined by the ADC circuitry 100. The time duration may in combination with knowledge of the reference input signal and a time duration of the run-up period be used for determining a value of the analog input signal.

Figure 2:
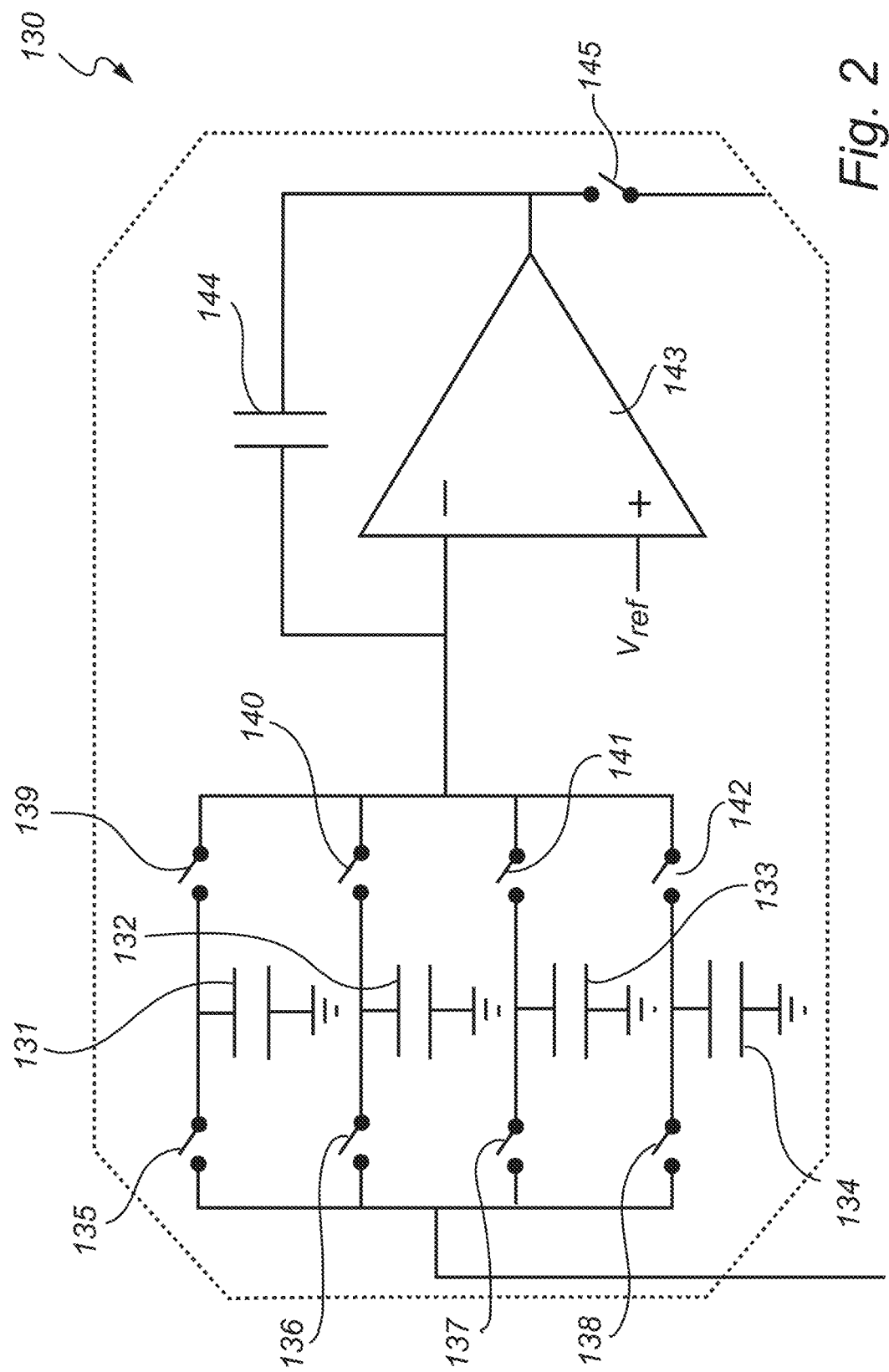
FIG. 2 is a schematic view of a feedforward noise shaping loop of the ADC circuitry according to an embodiment.

Referring now to FIG. 2, the feedforward noise shaping loop 130 according to an embodiment will be described. In the embodiment shown in FIG. 2, a second order feedforward noise shaping loop 130 is provided. The feedforward noise shaping loop 130 may comprise at least one capacitor for storing a quantization error signal to allow the quantization error signal to be used for noise shaping when digitizing later samples of the analog input signal.

As shown in FIG. 2, the feedforward noise shaping loop 130 may comprise a first set of noise shaping capacitors, having a first capacitor 131 and a second capacitor 132. The feedforward noise shaping loop 130 may further comprise a second set of noise shaping capacitors, having a first capacitor 133 and a second capacitor 134.

The quantization error signal remaining from digitizing a first sample may be stored in the first set of noise shaping capacitors. Thus, the feedforward noise shaping loop 130 may be configured to receive input from the integrator 102 at the end of the run-down time period. The quantization error, which is stored on the capacitor 110 may thus be transferred to the feedforward noise shaping loop 130. Thus, the capacitor 110 may be reset through a reset switch 112 between two samples of the analog input signal.

The feedforward noise shaping loop 130 may comprise switches 135, 136, 137, 138 for controlling that the quantization error signal is stored in desired capacitors of the feedforward noise shaping loop 130. The switches 135, 136 may be activated simultaneously (by being controlled by a common control signal) such that the quantization error signal of the first sample is stored in the first and second capacitors 131, 132 of the first set.

Similarly, the quantization error signal remaining from digitizing a second sample may be stored in the second set of noise shaping capacitors. The switches 137, 138 may be activated simultaneously (by being controlled by a common control signal) such that the quantization error signal of the second sample is stored in the first and second capacitors 133, 134 of the second set.

When the feedforward noise shaping signal is to be provided, the quantization error signals may be selectively read out from the first and second sets of noise shaping capacitors. The feedforward noise shaping loop may thus comprise switches 139, 140, 141, 142 for controlling which of the noise shaping capacitors 131, 132, 133, 134 to be used when forming a feedforward noise shaping signal.

When determining the feedforward noise shaping signal for a third sample, the first capacitor 133 of the second set and the second capacitor 132 of the first set may be used by activating switches 140, 141.

Thanks to the use of two sets of noise shaping capacitors, the quantization error of the third sample may be stored on the noise shaping capacitors 131, 132 of the first set to overwrite the quantization error information stored in the first set once the quantization error signals stored therein will no longer be used for forming quantization error signals for future samples. Then, the second set of noise shaping capacitors will store the quantization error signal of an older sample than the first set of noise shaping capacitors. Hence, when determining the feedforward noise shaping signal for a fourth sample, the first capacitor 131 of the first set and the second capacitor 134 of the second set may be used by activating switches 139, 142.

Thus, different capacitors of the first and second sets may be used for forming the feedforward noise shaping signal depending on whether the first or the second set stores a quantization error signal relating to an older sample. The first capacitor and second capacitors of each set may have different capacitances so as to provide different contributions to the feedforward noise shaping signal depending on which capacitor of the set is used for forming the feedforward noise shaping signal. The first capacitor 131 of the first set and the first capacitor 133 of the second set may have the same capacitance (first capacitance). The second capacitor 132 of the first set and the second capacitor 134 of the second set may have the same capacitance (second capacitance), where the first and second capacitances may be different. This implies that regardless whether the first set of capacitors or the second set of capacitors stores an older sample (and correspondingly whether switches 140 and 141 or 139 and 142 are used), the feedforward noise shaping signal may be determined in the same manner.

Thus, for a sequence of samples of the analog input signal, the feedforward noise shaping loop 130 may be configured to alternatingly store quantization error signals in the first set of noise shaping capacitors and in the second set of noise shaping capacitors.

The feedforward noise shaping loop 130 may further comprise a noise shaping integrator 143 for summing quantization error signals from each of the two sets of noise shaping capacitors, wherein the switches 139-142 determine which of the noise shaping capacitors 131-134 to be sued for providing the quantization error signals to the noise shaping integrator 143.

The noise shaping integrator 143 may be provided as an operational amplifier having an inverting input and a non-inverting input. The inverting input may receive the summed signal from the noise shaping capacitors 131-134 selected by the switches 139-142, whereas the inverting input may receive the reference input signal ($V_{ref}$).

The noise shaping integrator 143 may further have a feedback loop connecting the output of the operational amplifier to the inverting input through a feedback capacitor 144.

The noise shaping capacitors 131-134 of the first and second sets have a relationship with the feedback capacitor 144 of the noise shaping integrator 143. Together, the capacitors 131-134, 144 and the noise shaping integrator 143 form a filter. As long as the filter is stable, the capacitances of the first noise shaping capacitors 131, 133 and the second noise shaping capacitors 132, 134 can have different values.

Denoting the first capacitance $C_a$, the second capacitance $C_b$ and the capacitance of the feedback capacitor $C_f$, the feedforward noise shaping loop 130 may thus form a filter with the following response:

$$V_{RES\_O}(z) = \left(\frac{C_a}{C_f}z^{-1} + \frac{C_b}{C_f}z^{-2}\right)\frac{1}{1-z^{-1}}V_{RES\_I}(z),$$

where z is a sample number, $V_{RES\_O}$ is the output feedforward noise shaping signal for sample z and $V_{RES\_I}$ is the quantization error signal of sample z.

In FIG. 2, there is further shown an additional switch 145 for selectively connecting the feedforward noise shaping loop 130 to the comparator 120. This additional switch 145 may be used when more than one feedforward noise shaping loop 130 are used.

More than one feedforward noise shaping loop 130 may be used when multiplexing of analog input signals for multiple channels may be provided as input to the ADC circuitry 100. The ADC circuitry 100 may thus be used for plural analog input signals, such that the integrator 102 and the comparator 120 may be re-used for the multiple channels.

Each feedforward noise shaping loop 130 may be dedicated to a specific channel. Hence, quantization error signals may be stored in the feedforward noise shaping loop 130 between different time slots relating to the specific channel in a time-multiplexed analog input signal. Further, the respective feedforward noise shaping loop 130 may be activated through the additional switch 145 when the channel with which the feedforward noise shaping loop 130 is associated is being processed.

The ADC circuitry 100 may further comprise a gain element for amplifying the feedforward noise shaping signal. The gain element may be provided within the feedforward noise shaping loop 130 but may alternatively be provided in the comparator 120. The gain of the gain element may enable even better quantization noise suppression.

The comparator 120 may be configured to receive the feedforward noise shaping signal, such that the comparator 120 may receive the threshold signal (e.g. $V_{CM}$), the integrator output signal $INT_{OUT}$ and the feedforward noise shaping signal $V_{RES\_O}$. With a gain of 2 of the feedforward noise shaping signal, the output of the comparator 120 may thus be determined by:

$$V_{CM} + INT_{OUT} - 2V_{RES\_O}.$$

Although the feedforward noise shaping is discussed in detail above for second order noise shaping, it should be realized that higher order noise shaping may be used instead. This may provide better noise shaping. However, the filter of the feedforward noise shaping loop 130 may also be more complex.

Figure 3:
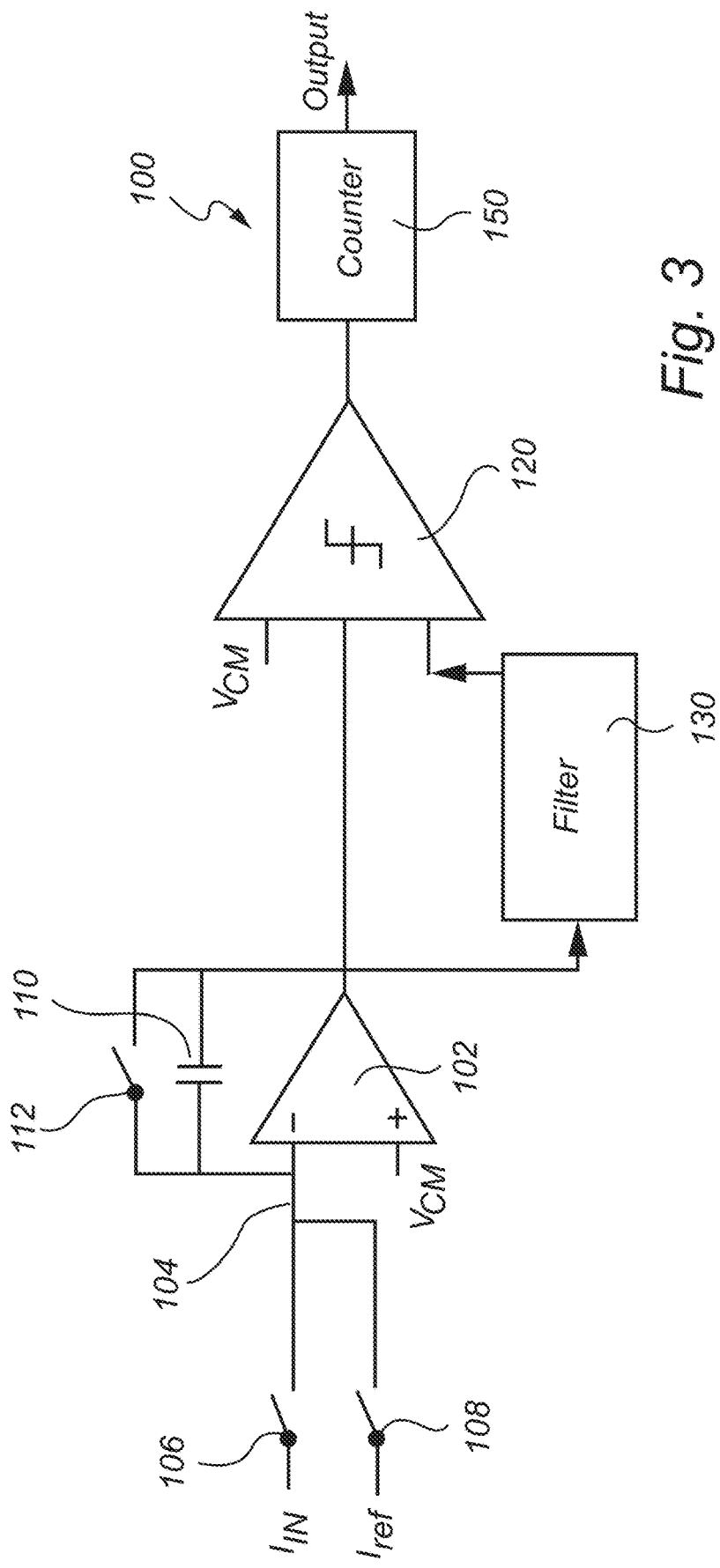
FIG. 3 is a schematic view of the ADC circuitry of FIG. 1, wherein the ADC circuitry is configured to receive an analog input signal in current domain.

In FIG. 1, the ADC circuitry 100 is illustrated as receiving the analog input signal and the reference input signal in voltage domain. As shown in FIG. 1, the analog input signal and the reference input signal may be passed through a respective resistor $R_1$ and $R_2$ before being provided at the inverting input of the integrator 102. However, as illustrated in FIG. 3, the ADC circuitry 100 may alternatively be configured to receive the analog input signal and the reference input signal in the current domain. As shown in FIG. 3, the analog input signal $I_{IN}$ and the reference input signal $I_{ref}$ may then be provided directly to the inverting input of the integrator 102.

Figure 4:
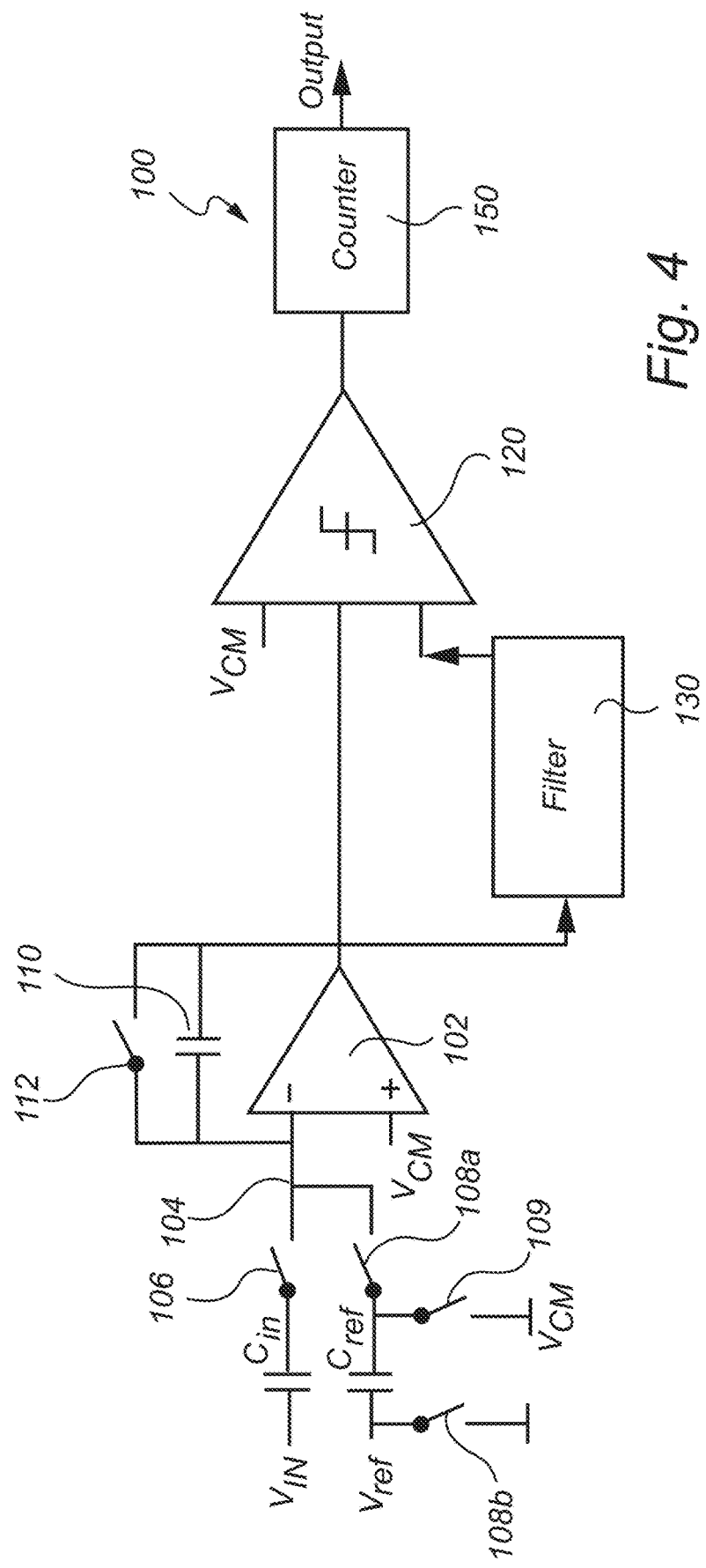
FIG. 4 is a schematic view of the ADC circuitry of FIG. 1, wherein the ADC circuitry is configured to receive an analog input signal in charge domain.

As further illustrated in FIG. 4, the ADC circuitry 100 may alternatively be configured to receive the analog input signal and the reference input signal in the charge domain, that is a charge stored on a capacitor $C_{in}$. The analog input signal may be provided in charge domain for instance by detecting the analog input signal from a touch screen or a pressure sensor. The switch 106 may select the analog input signal to be provided to the input 104 of the ADC circuitry 100. The charge on the capacitor $C_{in}$ holding the analog input signal may then be regarded as a current flowing into the capacitor when the switch 106 is closed.

A reference charge is stored on capacitor $C_{ref}$ for providing the reference input signal. Each time the reference charge is injected to the integrator 102, the integrator output will become closer to the threshold and the counter 150 may be incremented, until the integrator output reaches the threshold and the counter 150 is stopped.

A reference charge may be provided to the capacitor $C_{ref}$ by closing a switch 109 connecting the capacitor $C_{ref}$ to a reference input voltage $V_{ref}$ and the integrator reference signal $V_{CM}$. Thus, the charge on the capacitor $C_{ref}$ will be $(V_{ref}-V_{CM})*C_{ref}$, while switches 108a, 108b are open. When providing the reference input signal by injecting the reference charge, switches 108a, 108b are closed while switch 109 is open, connecting the capacitor $C_{ref}$ between ground and the input 104 of the ADC circuitry 100. Another reference charge may then again be provided to the capacitor $C_{ref}$ by switches 108a, 108b being open and switch 109 being closed.

Figure 5:
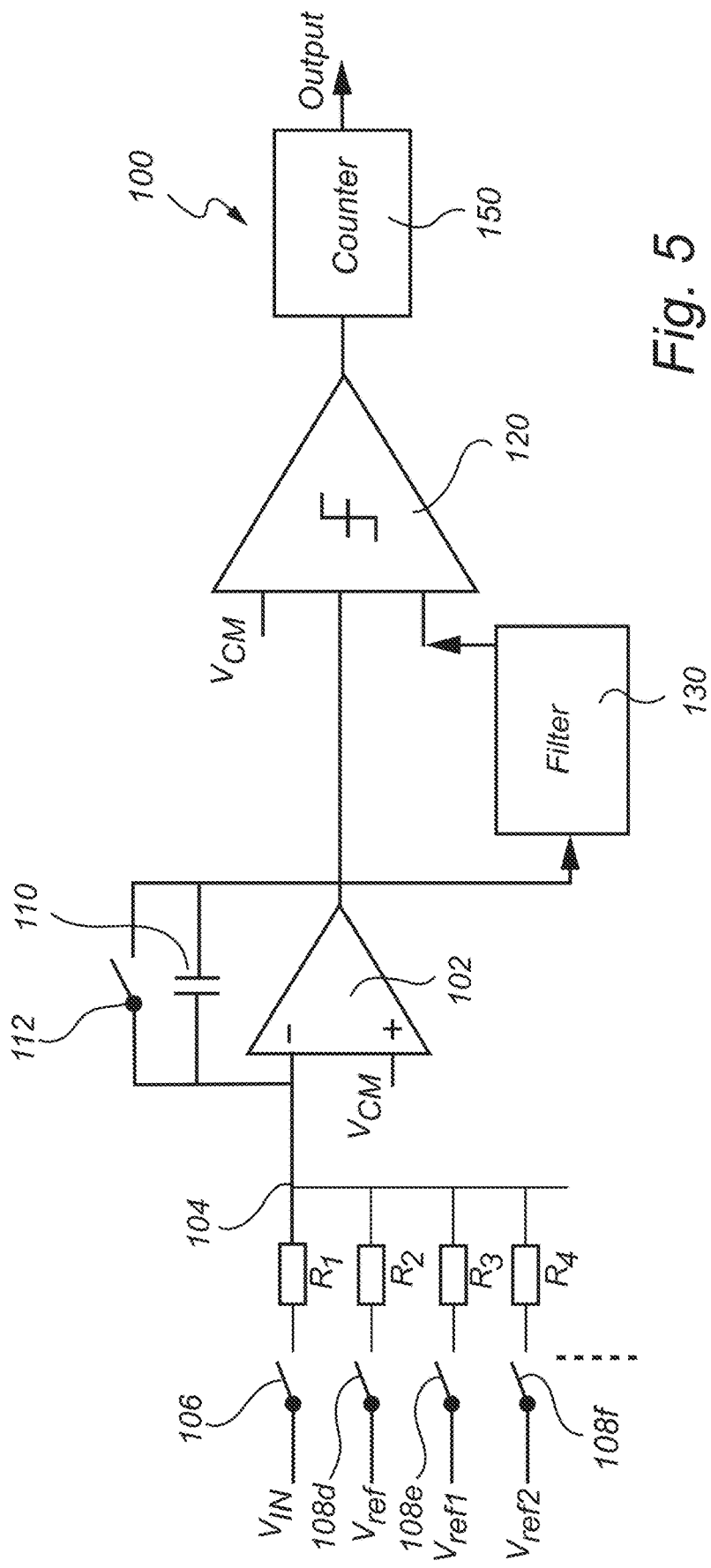
FIG. 5 is a schematic view of the ADC circuitry of FIG. 1, wherein the ADC circuitry is configured to receive a plurality of reference input signals.

Referring now to FIG. 5, the ADC circuitry 100 may according to an alternative be configured to selectively receive one of a plurality of reference input signals, $V_{ref}$, $V_{ref1}$, $V_{ref2}$, etc., based on switches 108d, 108e, 108f. Whereas the ADC circuitry 100 has been discussed above from a perspective of a dual-slope ADC (having one run-up time period and one run-down time period), the plurality of reference input signals $V_{ref}$, $V_{ref1}$, $V_{ref2}$ enables multi-slope analog-to-digital conversion.

The reference input signals $V_{ref}$, $V_{ref1}$, $V_{ref2}$ and/or resistances of resistors $R_2$, $R_3$, $R_4$ through which the reference input signals are connected to the input of the ADC circuitry 100 may have different values. The integrator 102 may be configured to integrate a first reference input signal $V_{ref}$ having a large first value during a first time duration until the integrator output reaches a first threshold and the integrator 102 may further be configured to integrate a second reference input signal $V_{ref1}$ having a small second value, smaller than the first value, during a second time duration until the integrator 102 reaches a second threshold. This implies that the integration towards a final threshold may be divided into several periods (or slopes) during which different reference input signals $V_{ref}$, $V_{ref1}$, $V_{ref2}$ are provided. Hence, the total time for reaching the final threshold may be reduced compared to the reference input signal having the smallest value being used for the entire time duration. Still, the resolution of the determination of the analog input signal may be based on the value of the smallest reference input signal, since the reference input signal having the smallest value may be used during a final period of integrating reference input signals. Thus, the quantization error is defined based on the reference input signal having the smallest value.

The plurality of reference input signals $V_{ref}$, $V_{ref1}$, $V_{ref2}$ may alternatively be adapted for determining digital representations of the analog input signal within different ranges. Thus, the ADC circuitry 100 may use one reference input signal for determining the digital representation of an analog input signal, such that each instance of determining a digital representation of the analog input signal uses a dual-slope setting of the ADC circuitry 100. However, at each instance, the reference input signal is selected based on a range within which a value of the analog input signal falls.

Figure 6:
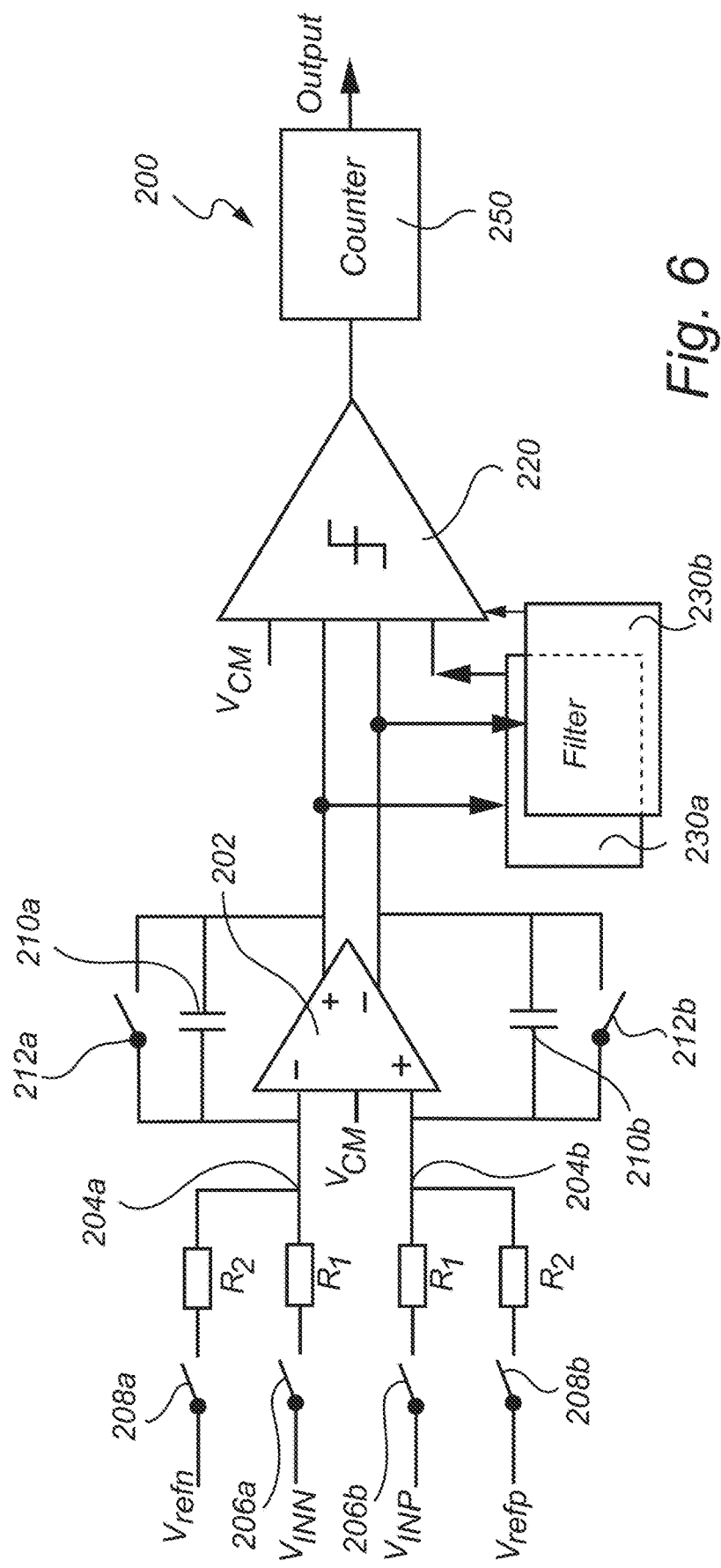
FIG. 6 is a schematic view of the ADC circuitry according to another embodiment for receiving fully differential analog input signals.

Referring now to FIG. 6, an ADC circuitry 200 according to an embodiment for analog-to-digital conversion of a fully differential signal will be discussed.

The ADC circuitry 200 may thus comprise inputs 204a, 204b for receiving differential input signals ($V_{INN}$ and $V_{INP}$)

and differential reference input signals ($V_{refn}$ and $V_{refp}$). Switches 206a, 206b and 208a, 208b may be used for controlling whether the differential input signals or the differential output signals are to be provided to the inputs 204a, 204b of the ADC circuitry 200.

The inputs 204a, 204b may be connected to the integrator 202 of the ADC circuitry 200. The integrator 202 may thus switchably receive the analog input signal and the reference input signal on the inputs 204 based on selection by the switches 206a, 206b and 208a, 208b.

Thus, the integrator 202 may be configured to integrate a difference between each of the differential input signals and the integrator reference signal $V_{CM}$ during a first time period (run-up time period). During the first time period, values at differential integrator outputs may be ramped. The differential integrator outputs may be stored on respective capacitors 210a, 210b, which may be connected between the integrator output and the respective input of the integrator 202.

Thus, after the first time period, which may be fixed at a constant duration, the capacitors 210a, 210b store a charge corresponding to the differential analog input signals and the duration of the first time period.

The integrator 202 may further be configured to integrate a difference between the reference input signals and the integrator reference signal during a second time period (run-down time period). During the second time period, the value at the integrator output after the first time period, as stored by the capacitors 210a, 210b, will be returned towards a threshold.

The ADC circuitry 200 further comprises a comparator 220. The comparator 220 is configured to compare the integrator outputs to the threshold, in the form of a threshold signal. As indicated in FIG. 6, the threshold signal may correspond to the integrator reference signal, such that the comparator 220 may receive as input the same signal as the integrator reference signal, $V_{CM}$, for defining the threshold of the comparator 220. The comparator 220 may further receive the integrator outputs as input to the comparator 220. The comparator 220 may provide an indication of an end of the run-down time period.

The ADC circuitry 200 may further comprise two feedforward noise shaping loops 230a, 230b, each associated with one of the integrator outputs. The feedforward noise shaping loops 230a, 230b may be configured to store quantization error signals remaining on the integrator outputs when the comparator 220 indicates an end of the run-down time period. The quantization errors for each of the differential input signals may be stored in the feedforward noise shaping loops 230a, 230b such that each feedforward noise shaping loop 230a, 230b may provide a feedforward noise shaping signal to the comparator 220 for changing the threshold of the comparator 220.

Hence, the comparator 220 may compare the integrator output signals to the threshold signal as affected by the feedforward noise shaping signal.

The ADC circuitry 200 may further comprise reset switches 212a, 212b for resetting the capacitors 210a, 210b between two samples of the analog input signal.

The ADC circuitry 200 further comprises a timer 250. The timer 250 may be configured to determine a time duration of the run-down time period, which may then be used for determining a digital representation of the differential analog input signals.

The ADC circuitry 100, 200 according to any of the above embodiments may be incorporated in an integrated circuit device. Thus, the ADC circuitry 100, 200 may be arranged on a single substrate providing for a compact arrangement of the ADC circuitry 100, 200.

The ADC circuitry 100, 200 may be combined with other circuitry in the integrated circuit device so as to combine the ADC circuitry 100, 200 with other functionality in a compact manner.

For instance, the integrated circuit device may provide further digital processing circuitry for further processing of the digital representation of the analog input signal as determined by the ADC circuitry 100, 200.

The digital processing circuitry may for instance comprise digital control blocks and/or digital filters for processing of the digital representation of the analog input signals. The digital processing circuitry may be provided e.g. in the form of specifically designed processing circuitry, such as an Application-Specific Integrated Circuit (ASIC) or a Field-Programmable Gate Array (FPGA).

Alternatively or additionally, the integrated circuit device may further comprise a sensor configured to generate the analog input signal. Thus, the ADC circuitry 100, 200 may be combined with a sensor in the integrated circuit device providing for a compact arrangement of a sensor providing a digital output from the sensor by a single integrated circuit device.

According to an embodiment, the integrated circuit device may combine a light detector of a photoplethysmogram (PPG) detector, which will be described below, with the ADC circuitry 100, 200. However, it should be realized that the PPG detector may alternatively provide the light detector and the ADC circuitry 100, 200 in separate units.

Figure 7:
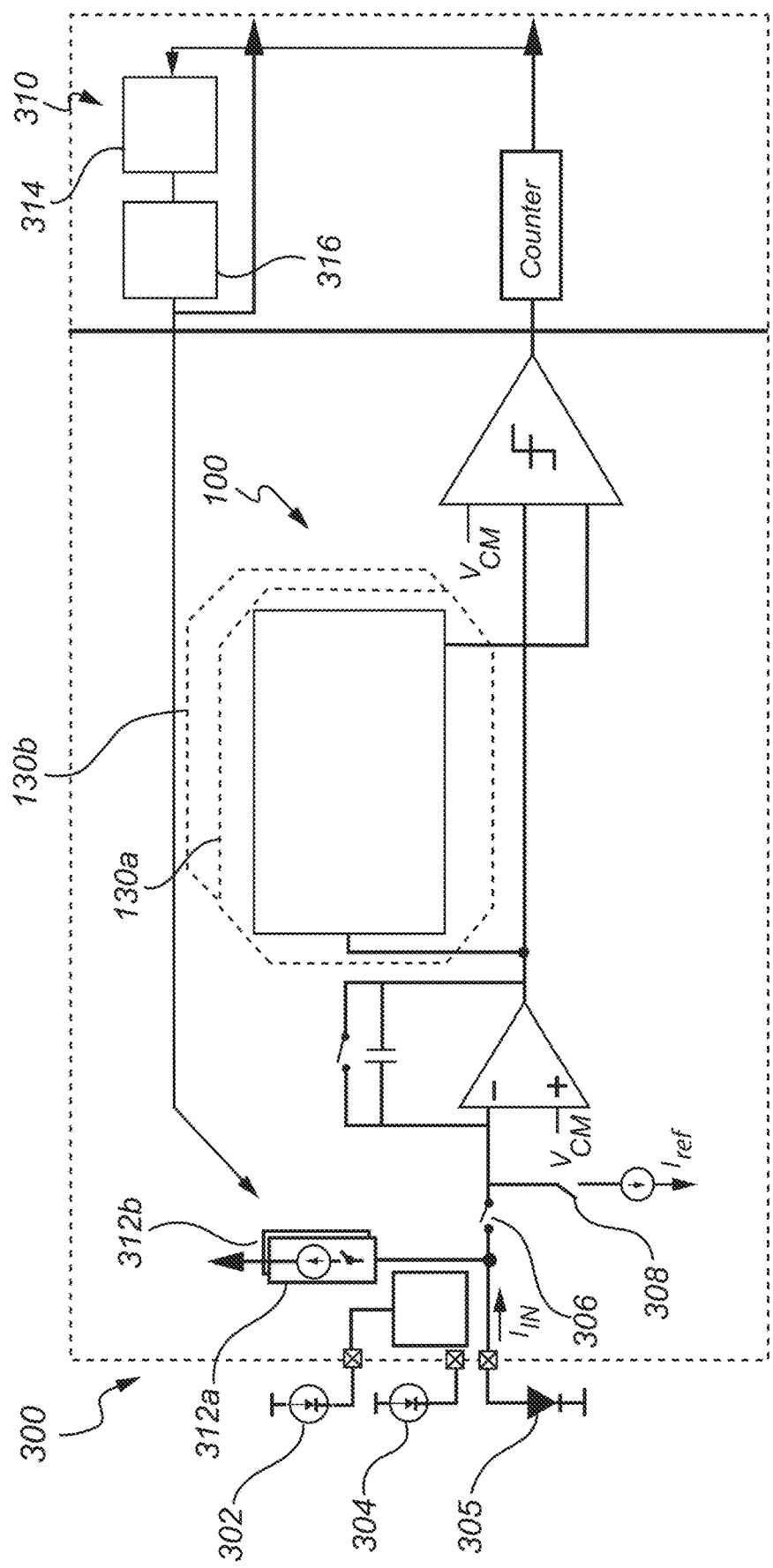
FIG. 7 is a schematic view of a photoplethysmogram detector according to an embodiment.

Referring now to FIG. 7, a PPG detector 300 will be described. The PPG detector 300 may incorporate the ADC circuitry according to any of the embodiments described above. As illustrated in FIG. 7, the ADC circuitry 100 configured to receive an analog input signal in current domain may be used.

The PPG detector 300 comprises at least one light source 302, 304 configured to generate pulsed light to illuminate skin of a subject for generating light modulated by blood flow of the subject. As shown in FIG. 7, two different light sources 302, 304 may be provided for generating pulsed light of two different wavelengths for enabling detection of blood oxygen saturation. The first light source 302 may be configured to generate light of a red wavelength, such as 655 nm. The second light source 304 may be configured to generate light of an infrared wavelength, such as 940 nm. Each of the first and the second light sources 302, 304 may be implemented as a light emitting diode (LED) dedicated to generating light of the respective wavelength. However, it should be realized that a single light source may be used, wherein the light source is tunable so as to alternatingly generate pulsed light of the two different wavelengths. Further, it should be realized that the PPG detector 300 may alternatively only use a single wavelength as the two wavelengths are primarily used for enabling detection of blood oxygen saturation in addition to a photoplethysmogram.

The PPG detector 300 may further comprise a light detector 305 configured to receive the modulated light from the subject. The light detector 305 may be configured to detect a light intensity and generate a corresponding analog input signal, which may be provided as input to the ADC circuitry 100. For instance, the light detector 305 may be implemented as a photodiode. Even when two different wavelengths are used, a single light detector 305 may be used for detecting light, since illumination by the different wavelengths may be sequentially provided.

The ADC circuitry 100 may receive time-multiplexed analog input signals relating to the two different wavelengths. The analog input signals may be provided to the same ADC circuitry 100. The ADC circuitry 100 may provide support for handling two channels, related to the two different wavelengths, by the ADC circuitry 100 comprising two feedforward noise shaping loops 130a, 130b, dedicated to providing a feedforward noise shaping signal for the respective channels.

The PPG detector 300 may further comprise switches 306, 308 for selecting whether the analog input signal from the light detector 305 or the reference input signal is to be provided to the input of the ADC circuitry 100.

The PPG detector 300 may further comprises a DC compensation loop 310. The DC compensation loop 310 may be configured to subtract large DC components from the analog input signal, so as to facilitate determination of a modulated signal on top of the large DC components.

The DC compensation loop 310 may thus comprise a current source for subtracting the large DC components before the analog input signal is received by the ADC circuitry 100. The current source may be implemented as a current digital-to-analog converter (IDAC), which is controlled by a digital signal and converts the digital signal to an analog current signal.

The DC compensation loop 310 may comprise two different IDACs 312a, 312b for providing DC compensation for each of the signals relating to the two different wavelengths provided by the light sources 302, 304. The IDACs 312a, 312b may be synchronized with the pulsed light of the light sources 302, 304.

The DC compensation loop 310 may be configured to receive the digital representation of the analog input signal from the timer 150. The digital representation may be stored in an accumulator 314 for enabling simple access to a stored value.

The DC compensation loop 310 may comprise a threshold filter 316, which may compare the digital representation of the analog input signal to digital thresholds defining a range of values that are desired to be provided by the ADC circuitry 100. When the threshold filter 316 finds that a value output by the ADC circuitry 100 is outside the range defined by the digital thresholds, a digital value provided to the corresponding IDAC 312a, 312b, may be incremented or decremented accordingly so as to force the value output by the ADC circuitry 100 to be within the desired range. Each of the digital thresholds of the threshold filter 316 may be provided with a built-in hysteresis to avoid the DC compensation loop 310 flickering between different values to be provided to the IDACs 312a, 312b.

The ADC circuitry 100 with the DC compensation loop 310 may output both values of the digital representation provided by the timer 150 and the IDAC values provided to control the IDACs 312a, 312b. These values may be summed to represent the analog input signal, such that a smooth signal may be provided without any glitches due to shifting of the IDAC values.

It should be realized that the ADC circuitry 100 may be used in a fully differential architecture in the PPG detector 300 for receiving fully differential analog input signals. Then, two DC compensation loops 310 may be provided for providing DC compensation to each of the fully differential analog input signals.

It should be further realized that a photodiode signal may be converted to voltage domain, e.g. through a transimpedance amplifier to provide the analog input signal in voltage domain to the ADC circuitry 100. In such case, the DC compensation loop 310 may instead comprise a capacitor digital-to-analog converter for subtracting a DC component from the analog input signal in voltage domain.

Figure 8:
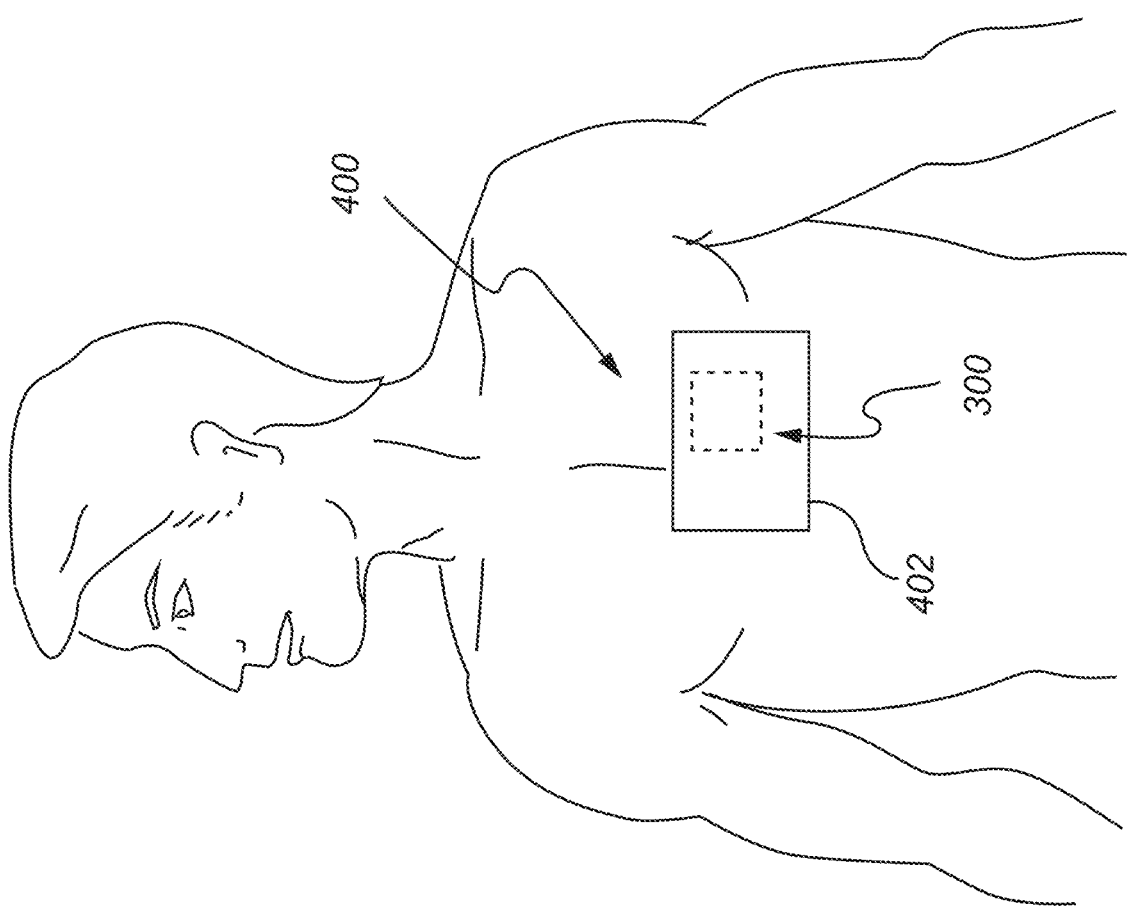
FIG. 8 is a schematic view of a wearable device according to an embodiment.

Referring now to FIG. 8, a wearable device 400 is illustrated. The wearable device 400 includes the PPG detector 300 as described above.

The wearable device 400 further comprises a carrier 402, which is configured to be worn on or around a body part of the subject and which is configured to carry the PPG detector 300.

In the illustrated embodiment in FIG. 8, the wearable device 400 comprises a carrier 402 which is configured to be worn on a chest of a subject. The carrier 402 is provided as a patch, comprising an adhesive surface for attaching the patch to the chest of the subject.

The PPG detector 300 provides support for handling a high dynamic range of the analog input signal, which is needed when a PPG is acquired from a chest of a subject, since there is a large DC component as well as large motion artifacts due to e.g. respiration. The ADC circuitry 100 is suited for handling a high dynamic range of the analog input signal, since the ADC circuitry 100 provides a high resolution, while the use of the feedforward noise shaping loop 130 allows the analog-to-digital conversion to be quickly performed.

Thus, the PPG detector 300 may be incorporated in a wearable device 400 to be worn at the chest of the subject. This enables the PPG detector 300 to be combined in the wearable device 400 with other detectors that are suited for being arranged at the chest of the subject, e.g. an electrocardiogram (ECG) detector.

Figure 9:
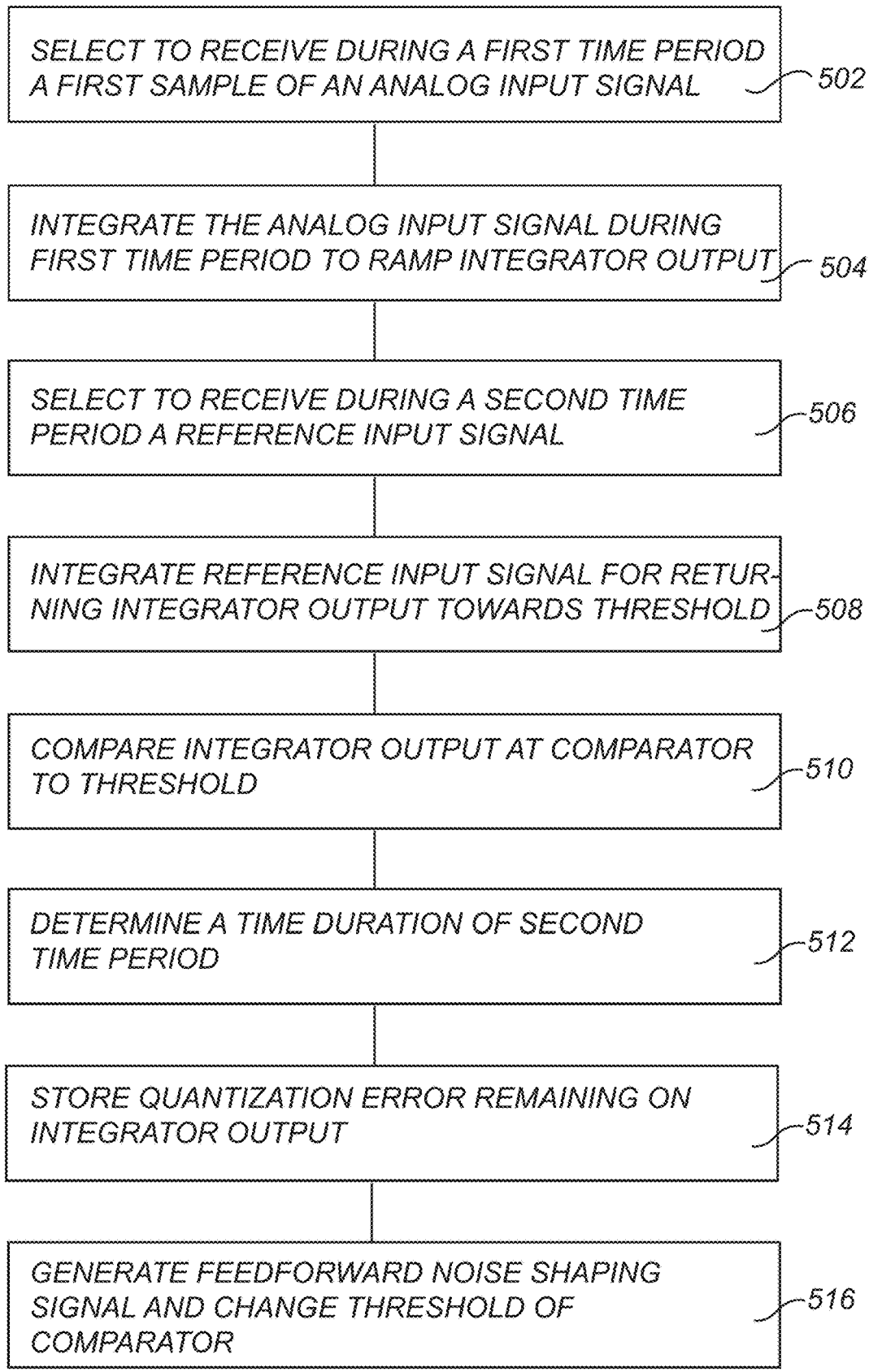
FIG. 9 is a flow chart of a method according to an embodiment.
Figure 10:
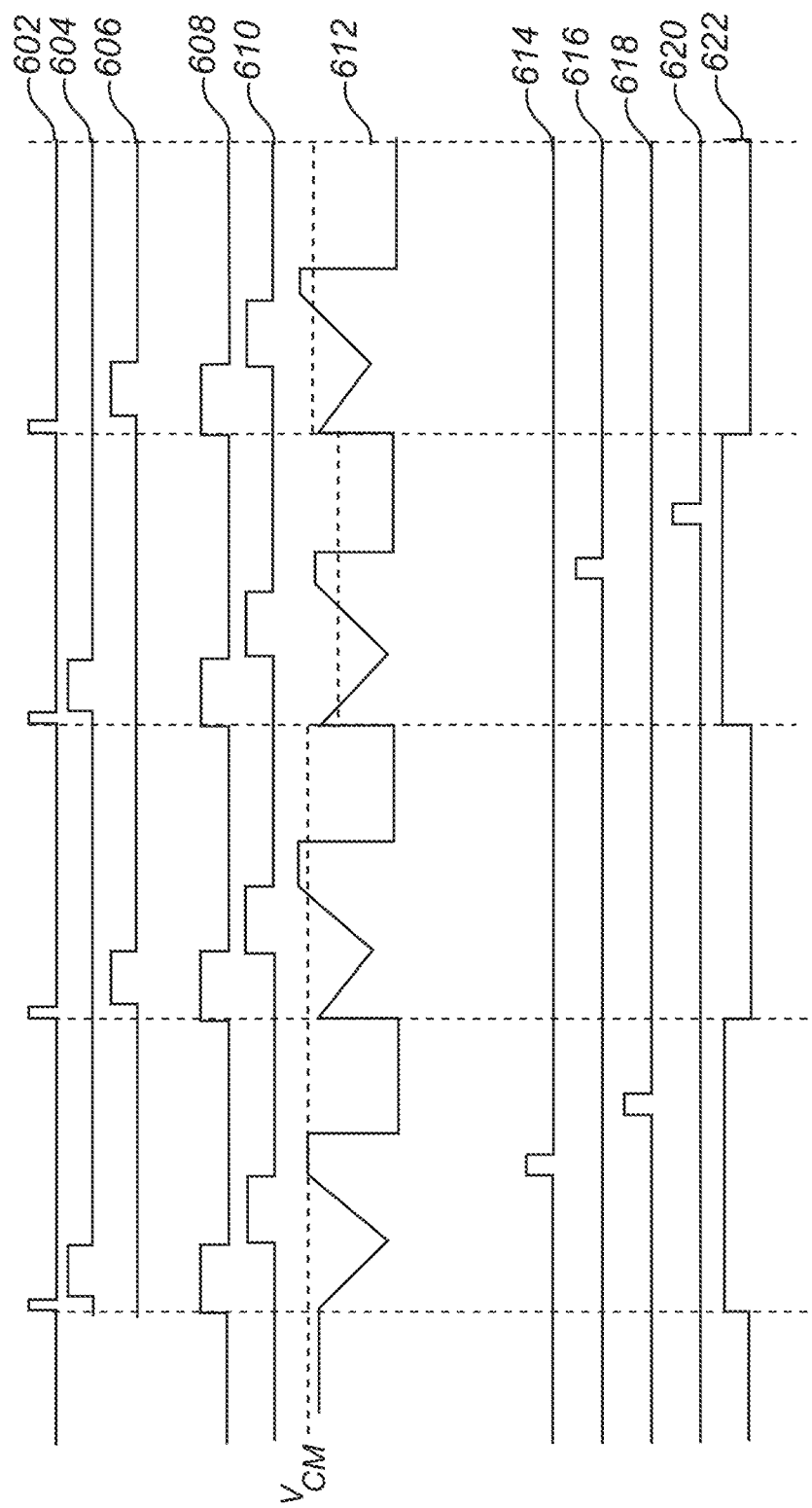
FIG. 10 is a timing diagram illustrating signals in the ADC circuitry.

Referring now to FIGS. 9-10, a method for analog-to-digital conversion of an analog input signal will be described. FIG. 9 shows a flow chart of the method, whereas FIG. 10 shows a diagram illustrating timing of signals.

The timing of signals may be controlled by a control unit together with an internal clock. The control unit and the internal clock may be provided in the integrated circuit device incorporating the ADC circuitry 100, 200.

Below, reference is made to the ADC circuitry 100 described in relation to FIGS. 1-5. However, it should be realized that the method may be similarly implemented for the ADC circuitry 200 described in relation to FIG. 6.

First, the reset switch 112 may be activated in order to reset the capacitor 110 of the ADC circuitry 100. Hence, as illustrated in FIG. 10, the signal 602 for controlling the reset switch 112 may be high for a short duration. Then, the ADC circuitry 100 is prepared to perform analog-to-digital conversion for a new sample of an analog input signal.

The method comprises selecting to receive 502, during a first time period, a first sample of an analog input signal to be converted to a digital representation. The analog input signal may be received at the input 104 of the ADC circuitry 100. Thus, the switch 106 may be activated in order to allow the analog input signal to be received at the input 104 of the ADC circuitry 100. As illustrated in FIG. 10, the signal 608 for controlling the switch 106 may thus be high for a duration defining the first time period.

For the case of the PPG detector 300, the first light source 302 and the corresponding IDAC 312a may also be activated during the first time period, as illustrated by the signal 604 in FIG. 10. Generally speaking, any component involved in acquiring of the analog input signal may be set active during the first time period through control by a control signal. However, the acquisition of the analog input signal may not necessarily need an active component for creating a response that is detected.

The method may further comprise integrating 504 the analog input signal by the integrator 102 connected to the capacitor 110 during the first time period for ramping the integrator output. As illustrated in FIG. 10, the integrator output 612 may thus be continuously ramped during the first time period. In the set-up in FIG. 10, the integrator output 612 may be continuously decreased from a reference voltage level.

The method may further comprise selecting to receive 506, during a second time period following the first time period, a reference input signal at the input 104. Thus, the switch 108 may be activated in order to allow the analog input signal to be received at the input 104 of the ADC circuitry 100. As illustrated in FIG. 10, the signal 610 for controlling the switch 108 may thus be high during a second time period.

The method may further comprise integrating 508 the reference input signal for returning integrator output towards a threshold. As illustrated in FIG. 10, the integrator output 612 may thus be continuously ramped during the second time period to return to the threshold level.

While the integrator integrates the reference input signal, the method may further comprise comparing 510 the integrator output 612 at the comparator 120 to the threshold. Once the comparator 120 finds that the integrator output 612 has reached the threshold, the integration of the reference input signal may be terminated by the signal 610 for controlling the switch 108 going low.

The method may further comprise determining 512 a time duration of the second time period during which the reference input signal is integrated. The time duration thus provides a digital representation of the analog input signal value.

The method may further comprise storing 514, in at least one noise shaping capacitor 131-134 of the feedforward noise shaping loop 130, a quantization error signal that remains on the integrator output, after the second time period. As illustrated in FIG. 10, the signal 614 for controlling the switches 135, 136 may be high for controlling the quantization error signal to be transferred from the integrator output to the first and second capacitors 131, 132 of the first set.

The method may further comprise generating 516 a feedforward noise shaping signal based on the stored quantization error signal and changing the threshold of the comparator 120 based on the feedforward noise shaping signal for a later sample of the analog input signal. As illustrated in FIG. 10, the signal 618 for controlling the switches 139 and 142 may be high for controlling the quantization error signals stored in the first capacitor 131 of the first set and in the second capacitor 134 in the second set to be provided to an input of the noise shaping integrator 143.

In FIG. 10, a timing diagram using an analog input signal having two channels, as for the PPG detector 300 comprising two LEDs 302, 304 is illustrated. Thus, during analog-to-digital conversion of a first sample of a first channel, the additional switch 145 of the feedforward noise shaping loop 130 a may be active, as indicated by the signal 622 in FIG. 10. This implies that the feedforward noise shaping signal is provided to the comparator 120.

After analog-to-digital conversion of the first sample, at least some components may be shut down before analog-to-digital conversion of a following sample. For instance, the LEDs 302, 304, IDACs 312a, 312b, the integrator 102 and the comparator 120 of the ADC circuitry 100 may be shut down. This is illustrated in FIG. 10, showing that the integrator output 612 goes low during a shut-down period.

As mentioned above, FIG. 10 illustrates a timing diagram using an analog input signal having two channels. Thus, after analog-to-digital conversion of the first sample of the first channel, analog-to-digital conversion of a first sample of the second channel is performed.

Thus, the signal 602 for controlling the reset switch 112 is first high to reset the capacitor 110 of the ADC circuitry 100. Then, the signal 608 for controlling the switch 106 may thus be high for a duration defining the first time period to provide the first sample of the second channel to the ADC circuitry 100. The second light source 304 and the corresponding IDAC 312b may also be activated during the first time period, as illustrated by the signal 606 in FIG. 10.

As illustrated in FIG. 10, the integrator output 612 may thus be continuously ramped during the first time period. In the set-up in FIG. 10, the integrator output 612 may be continuously decreased from a reference voltage level.

Although not illustrated in FIG. 10, the ADC circuitry 100 comprises a second feedforward noise shaping loop 130b, which stores the quantization error signals relating to the analog-to-digital conversion of the second channel. Thus, the quantization error signal based on conversion of the first sample of the second channel will be transferred to the noise shaping capacitors of the feedforward noise shaping loop 130b. Further, quantization error signals are provided to an input of the noise shaping integrator of the feedforward noise shaping loop 130b. Additionally, during analog-to-digital conversion of the first sample of the second channel, the additional switch of the feedforward noise shaping loop 130b may be active.

As further illustrated in FIG. 10, after analog-to-digital conversion of the first sample of the second channel, analog-to-digital conversion of a second sample of the first channel is performed, in a similar manner as described above for conversion of the first sample of the first channel. However, as illustrated in FIG. 10, the feedforward noise shaping signal changes the threshold to which the integrator output 612 is compared.

Further, the quantization error signal that remains on the integrator output, after the second time period for analog-to-digital conversion of the second sample of the first channel may be stored to the feedforward noise shaping loop. As illustrated in FIG. 10, the signal 616 for controlling the switches 137, 138 may be high for controlling the quantization error signal to be transferred from the integrator output to the first and second capacitors 133, 134 of the second set.

As further illustrated in FIG. 10, the signal 620 for controlling the switches 140 and 141 may then be high for controlling the quantization error signals stored in the second capacitor 132 of the first set and in the first capacitor 133 in the second set to be provided to the input of the noise shaping integrator 143.

In the above the inventive concept has mainly been described with reference to a limited number of examples. However, as is readily appreciated by a person skilled in the art, other examples than the ones disclosed above are equally possible within the scope of the inventive concept, as defined by the appended claims.

The invention claimed is:

1. An analog-to-digital converter, ADC, circuitry, comprising:
    an input for receiving an analog input signal to be converted to a digital representation, and a reference input signal;

an integrator connected to a capacitor, wherein the integrator is configured to switch between integrating the analog input signal for ramping an integrator output and allow a charge to build up on the capacitor and integrating the reference input signal for returning integrator output towards a threshold;

a comparator for comparing integrator output to the threshold; and a timer for determining a time duration during which the reference input signal is integrated for changing the integrator output to reach the threshold, wherein the time duration provides a digital representation of an analog input signal value;

wherein the ADC circuitry further comprises a feedforward noise shaping loop comprising at least one noise shaping capacitor configured to store a quantization error signal remaining on the integrator output based on digitizing a first sample of the analog input signal, wherein the comparator is configured to receive a feedforward noise shaping signal from the feedforward noise shaping loop based on the quantization error signal stored by the at least one noise shaping capacitor for changing the threshold of the comparator for digitizing a later sample of the analog input signal following the first sample.

2. The ADC circuitry according to claim 1, wherein the feedforward noise shaping loop comprises two sets of noise shaping capacitors for storing quantization error signals from digitizing a first and a second sample of the analog input signal, respectively, wherein the feedforward noise shaping loop forms a second order noise shaping loop using quantization error signals from the first sample and the second sample for changing the threshold of the comparator for digitizing a third sample of the analog input signal following the first and the second samples.

3. The ADC circuitry according to claim 2, wherein the feedforward noise shaping loop further comprises a noise shaping integrator for summing quantization error signals from each of the two sets of noise shaping capacitors to form the feedforward noise shaping signal.

4. The ADC circuitry according to claim 3, wherein each set of noise shaping capacitors comprises a first noise shaping capacitor having a first capacitance and a second noise shaping capacitor having a second capacitance, and wherein the noise shaping integrator is configured to receive a quantization error signal from the first noise shaping capacitor of the set of noise shaping capacitors representing the second sample and a quantization error signal from the second noise shaping capacitor of the set of noise shaping capacitors representing the first sample.

5. The ADC circuitry according to claim 2, wherein the feedforward noise shaping loop is configured to alternatingly store quantization error signals of a sequence of samples in a first set of noise shaping capacitors and in a second set of noise shaping capacitors.

6. The ADC circuitry according to claim 1, wherein the ADC circuitry further comprises a gain element for amplifying the feedforward noise shaping signal.

7. The ADC circuitry according to claim 1, wherein the input is configured to receive analog input signals in multiple channels, wherein the ADC circuitry comprises multiple feedforward noise shaping loops for storing quantization error signals for the multiple channels.

8. The ADC circuitry according to claim 1, wherein the timer comprises a counter configured to output a multi-bit digital representation of the analog input signal value.

9. The ADC circuitry according to claim 1, wherein the ADC circuitry is configured to receive the analog input signal in current domain, voltage domain or charge domain.

10. An integrated circuit device, comprising:
an ADC circuitry according to claim 1, wherein the ADC circuitry is configured to receive an analog input signal for converting the analog input signal to a digital representation; and
digital processing circuitry for digital processing of the digital representation of the analog input signal.

11. A photoplethysmogram, PPG, detector, comprising:
at least one light source configured to generate pulsed light to illuminate skin of a subject for generating light modulated by blood flow of the subject;
a light detector configured to receive the modulated light from the subject, said light detector configured to generate an analog input signal; and
an ADC circuitry according to claim 1, wherein the ADC circuitry is configured to receive the analog input signal from the light detector for converting the analog input signal to a digital representation.

12. The PPG detector according to claim 11, further comprising a DC compensation loop synchronized with the pulsed light, wherein the DC compensation loop comprises a current digital-to-analog converter connected at the input for subtracting DC components from the analog input signal, wherein the DC compensation loop further comprises a threshold filter for providing an output for controlling the current digital-to-analog converter based on the digital representation of the analog input signal.

13. The PPG detector according to claim 11, wherein the at least one light source is configured to alternatingly generate pulsed light of two different wavelengths for enabling detection of blood oxygen saturation, wherein the analog input signal comprises two alternating signals related to the two different wavelengths, and wherein the ADC circuitry comprises two feedforward noise shaping loops for handling noise shaping of the two alternating signals.

14. A wearable device comprising:
the PPG detector according to claim 11,
at least one carrier, which is configured to be worn on or around a body part of the subject, wherein the at least one carrier is configured to carry the PPG detector.

15. A method for analog-to-digital conversion of an analog input signal, comprising:
select to receive, during a first time period, a first sample of an analog input signal to be converted to a digital representation at an input of an analog-to-digital converter, ADC, circuitry;
integrate the analog input signal by an integrator connected to a capacitor during the first time period for ramping an integrator output;
select to receive, during a second time period following the first time period, a reference input signal at the input;
integrate the reference input signal for returning integrator output towards a threshold;
compare the integrator output at a comparator to the threshold;
determine a time duration of the second time period during which the reference input signal is integrated for changing the integrator output to reach the threshold, wherein the time duration provides a digital representation of an analog input signal value;

store, in at least one noise shaping capacitor of a feedforward noise shaping loop, a quantization error signal remaining on the integrator output, after the second time period; and
generate a feedforward noise shaping signal based on the stored quantization error signal and change the threshold of the comparator based on the feedforward noise shaping signal for a later sample of the analog input signal.

* * * * *